(12) United States Patent
Lin

(10) Patent No.: US 11,094,917 B2
(45) Date of Patent: Aug. 17, 2021

(54) COVER PLATE FOR ORGANIC ELECTROLUMINESCENT DISPLAY DEVICE AND METHOD FOR MANUFACTURING THE SAME, ORGANIC ELECTROLUMINESCENT DISPLAY DEVICE AND DISPLAY APPARATUS

(71) Applicant: BOE Technology Group Co., Ltd., Beijing (CN)

(72) Inventor: Chuni Lin, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 95 days.

(21) Appl. No.: 16/328,927

(22) PCT Filed: Jun. 22, 2018

(86) PCT No.: PCT/CN2018/092481
§ 371 (c)(1),
(2) Date: Feb. 27, 2019

(87) PCT Pub. No.: WO2019/041987
PCT Pub. Date: Mar. 7, 2019

(65) Prior Publication Data
US 2020/0161588 A1     May 21, 2020

(30) Foreign Application Priority Data
Sep. 1, 2017    (CN) .......................... 201710778971.2

(51) Int. Cl.
*H01L 51/52*     (2006.01)
*H01L 27/32*     (2006.01)

(52) U.S. Cl.
CPC ...... *H01L 51/5281* (2013.01); *H01L 27/3253* (2013.01); *H01L 27/3272* (2013.01);
(Continued)

(58) Field of Classification Search
CPC ............. H01L 27/3253; H01L 51/5281; H01L 51/5284; H01L 51/525; H01L 27/3272; H01L 51/5253
(Continued)

(56) References Cited

U.S. PATENT DOCUMENTS

| | | |
|---|---|---|
| 9,165,994 B1 | 10/2015 | Yang et al. |
| 9,748,512 B2 | 8/2017 | Kim et al. |

(Continued)

FOREIGN PATENT DOCUMENTS

| | | |
|---|---|---|
| CN | 1949039 A | 4/2007 |
| CN | 1967863 A | 5/2007 |

(Continued)

OTHER PUBLICATIONS

First Office Action, including Search Report, for Chinese Patent Application No. 201710778971.2, dated Jun. 26, 2019, 18 pages.
(Continued)

*Primary Examiner* — David Vu
*Assistant Examiner* — Brandon C Fox
(74) *Attorney, Agent, or Firm* — Westman, Champlin & Koehler, P.A.

(57) ABSTRACT

The present disclosure proposes a cover plate for an organic electroluminescent display device and a method for manufacturing the same. The cover plate for the organic electroluminescent display device includes: an auxiliary electrode disposed on a substrate to be electrically connected to an electrode of the organic electroluminescent display device; and a light reflection suppression structure disposed on the auxiliary electrode and configured to suppress reflection of light from a surface of the auxiliary electrode. The present disclosure further proposes an organic electroluminescent display device and a display apparatus.

18 Claims, 5 Drawing Sheets

(52) U.S. Cl.
CPC ........ *H01L 51/525* (2013.01); *H01L 51/5253* (2013.01); *H01L 51/5284* (2013.01)

(58) Field of Classification Search
USPC .......................................................... 257/40
See application file for complete search history.

(56) References Cited

U.S. PATENT DOCUMENTS

| | | |
|---|---|---|
| 9,978,994 B2 | 5/2018 | Shen et al. |
| 2007/0096124 A1 | 5/2007 | Shin et al. |
| 2010/0097295 A1* | 4/2010 | Kwak ................. H01L 51/5284 345/32 |
| 2012/0097990 A1* | 4/2012 | Koh .................... H01L 27/3244 257/88 |
| 2014/0077171 A1* | 3/2014 | Yamakita .............. H01L 51/525 257/40 |
| 2015/0034913 A1* | 2/2015 | Yoon .................... H01L 51/525 257/40 |
| 2015/0228700 A1 | 8/2015 | Cho et al. |
| 2015/0318339 A1* | 11/2015 | Nakamura .......... H01L 51/5234 257/98 |
| 2016/0035980 A1 | 2/2016 | Kong et al. |
| 2016/0233458 A1 | 8/2016 | Shen et al. |
| 2016/0276619 A1* | 9/2016 | Cheng .................... H01L 51/56 |

FOREIGN PATENT DOCUMENTS

| | | |
|---|---|---|
| CN | 103715231 A | 4/2014 |
| CN | 203631557 U | 6/2014 |
| CN | 104952901 A | 9/2015 |
| CN | 105633297 A | 6/2016 |
| KR | 10-2016-0010199 A | 1/2016 |

OTHER PUBLICATIONS

International Search Report and Written Opinion (including English translations of search report and Box V of the Written Opinion) for International Application No. PCT/CN2018/092481, dated Sep. 27, 2018, 13 pages.

Extended European search report for European Patent Application No. 18847208.8, dated Apr. 29, 2021, 7 pages.

* cited by examiner

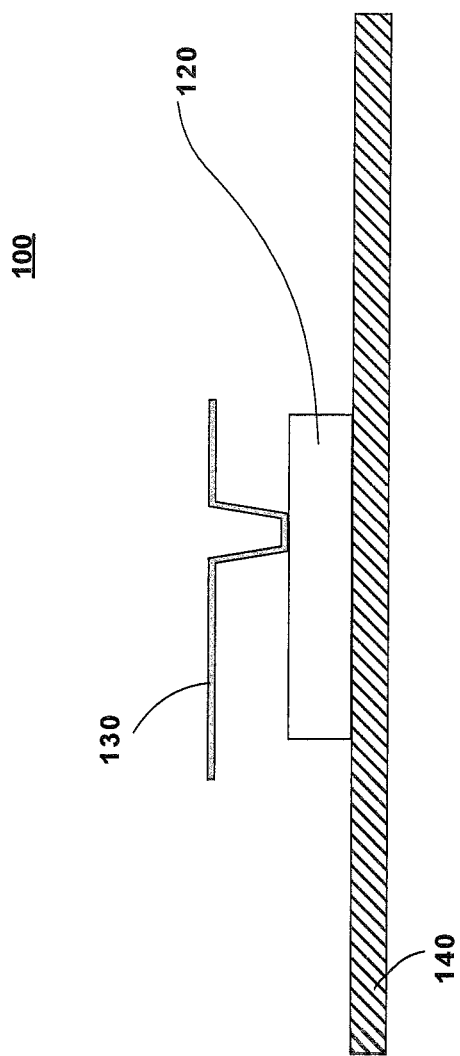

COVER PLATE FOR ORGANIC ELECTROLUMINESCENT DISPLAY DEVICE AND METHOD FOR MANUFACTURING THE SAME, ORGANIC ELECTROLUMINESCENT DISPLAY DEVICE AND DISPLAY APPARATUS

CROSS-REFERENCE TO RELATED APPLICATION(S)

This application claims priority to the Chinese Patent Application No. 201710778971.2, filed on Sep. 1, 2017, which is incorporated herein by reference in its entirety.

TECHNICAL FIELD

The present disclosure relates to the field of display technology, and more particularly, to a cover plate for an organic electroluminescent display device and a method for manufacturing the same, an organic electroluminescent display device, and a display apparatus.

BACKGROUND

Compared with Liquid Crystal Display (LCD) devices, Organic Light Emitting Diodes (OLEDs) have advantages such as lower power consumption, higher response speed, wider viewing angle and higher contrast etc. However, in an OLED, there is a phenomenon of color mixing of light emitted from the OLED.

SUMMARY

The present disclosure proposes a cover plate for an organic electroluminescent display device and a method for manufacturing the same, an organic electroluminescent display device, and a display apparatus.

According to an aspect of the present disclosure, there is proposed a cover plate for an organic electroluminescent display device. The cover plate for the organic electroluminescent display device comprises: an auxiliary electrode disposed on a substrate to be electrically connected to an electrode of the organic electroluminescent display device; and a light reflection suppression structure disposed on the auxiliary electrode and configured to suppress reflection of light from a surface of the auxiliary electrode.

In one embodiment, the light reflection suppression structure comprises a first insulating layer, a conductive layer and a second insulating layer which are stacked, wherein the conductive layer is disposed on the first insulating layer, and is electrically connected to the auxiliary electrode, and the second insulating layer is disposed on the conductive layer, wherein the first insulating layer has a first refractive index, the second insulating layer has a second refractive index, and the conductive layer has a third refractive index greater than the first and second refractive indices.

In one embodiment, in a direction perpendicular to the substrate, a projection of the auxiliary electrode on the substrate, a projection of the first insulating layer on the substrate, a projection of the conductive layer on the substrate and a projection of the second insulating layer on the substrate at least partially overlap.

In one embodiment, the cover plate for the organic electroluminescent display device further comprises: a protective layer disposed on the auxiliary electrode, wherein the conductive layer is electrically connected to the auxiliary electrode through a through hole in the protective layer which is above the auxiliary electrode.

In one embodiment, the cover plate for the organic electroluminescent display device further comprises: a spacer. The spacer is arranged on the protective layer or the first insulating layer and covered by the conductive layer, wherein a portion of the conductive layer which covers the spacer is used to be electrically connected to the electrode of the organic electroluminescent display device.

In one embodiment, the light reflection suppression structure comprises: a conductive layer, wherein a surface of the conductive layer away from the substrate is a diffuse reflective surface.

In one embodiment, the cover plate for the organic electroluminescent display device further comprises: a protective layer. The protective layer is disposed between the auxiliary electrode and the conductive layer, wherein the conductive layer is electrically connected to the auxiliary electrode through a through hole in the protective layer which is above the auxiliary electrode.

In one embodiment, the cover plate for the organic electroluminescent display device further comprises: a spacer. The spacer is arranged on the protective layer and covered by the conductive layer, wherein a portion of the conductive layer which covers the spacer is used to be electrically connected to the electrode of the organic electroluminescent display device.

In one embodiment, in a direction perpendicular to the substrate, a projection of the spacer on the substrate and a projection of the auxiliary electrode on the substrate do not overlap each other.

In one embodiment, in a direction perpendicular to the substrate, a projection of the spacer on the substrate and a projection of the auxiliary electrode on the substrate do not overlap each other.

In one embodiment, the cover plate for the organic electroluminescent display device further comprises: a black matrix. The black matrix is disposed between the substrate and the auxiliary electrode, and in a direction perpendicular to the substrate, a projection of the auxiliary electrode on the substrate is located within a projection of the black matrix on the substrate.

According to another aspect of the present disclosure, there is proposed a method for manufacturing a cover plate for an organic electroluminescent display device. The method comprises: forming an auxiliary electrode to be electrically connected to an electrode of the organic electroluminescent display device; and forming, on the auxiliary electrode, a light reflection suppression structure for suppressing reflection of light from a surface of the auxiliary electrode.

In one embodiment, the step of forming a light reflection suppression structure comprises: forming a first insulating layer, forming a conductive layer on the first insulating layer, so that the conductive layer is electrically connected to the auxiliary electrode, and forming a second insulating layer on the conductive layer. The first insulating layer has a first refractive index, the second insulating layer has a second refractive index, and the conductive layer has a third refractive index greater than the first and second refractive indices.

In one embodiment, the method further comprises: forming a protective layer on the auxiliary electrode; and forming a through hole in the protective layer above the auxiliary electrode, wherein the first insulating layer is disposed on the protective layer, and the conductive layer is electrically connected to the auxiliary electrode through the through hole.

In one embodiment, the method further comprises: forming a spacer on the protective layer or the first insulating layer, wherein the spacer is covered by the conductive layer, so that the spacer is connected to the auxiliary electrode through the conductive layer. A portion of the conductive layer which covers the spacer is used to be electrically connected to the electrode of the organic electroluminescent display device.

In one embodiment, the step of forming a light reflection suppression structure comprises: forming a conductive layer, so that the conductive layer is electrically connected to the auxiliary electrode, wherein a surface of the conductive layer away from the substrate is a diffuse reflective surface.

In one embodiment, the method further comprises: forming a protective layer between the auxiliary electrode and the conductive layer; and forming a through hole in the protective layer above the auxiliary electrode, wherein the conductive layer is electrically connected to the auxiliary electrode through the through hole.

In one embodiment, the method further comprises: forming a spacer on the protective layer, wherein the spacer is covered by the conductive layer, so that the spacer is connected to the auxiliary electrode through the conductive layer, wherein a portion of the conductive layer which covers the spacer is used to be electrically connected to the electrode of the organic electroluminescent display device.

According to yet another aspect of the present disclosure, there is proposed an organic electroluminescent display device. The organic electroluminescent display device comprises the cover plate for the organic electroluminescent display device according to various embodiments described above.

According to a further aspect of the present disclosure, there is proposed a display apparatus. The display apparatus comprises the organic electroluminescent display device described above.

BRIEF DESCRIPTION OF THE ACCOMPANYING DRAWINGS

The above and other purposes, features and advantages of the present disclosure will become more apparent from the following description of the embodiments of the present disclosure with reference to the accompanying drawing, in which:

FIG. 1A illustrates a schematic structural view of a cover plate for an organic electroluminescent display device according to an embodiment of the present disclosure;

DETAILED DESCRIPTION

Figure 1B:
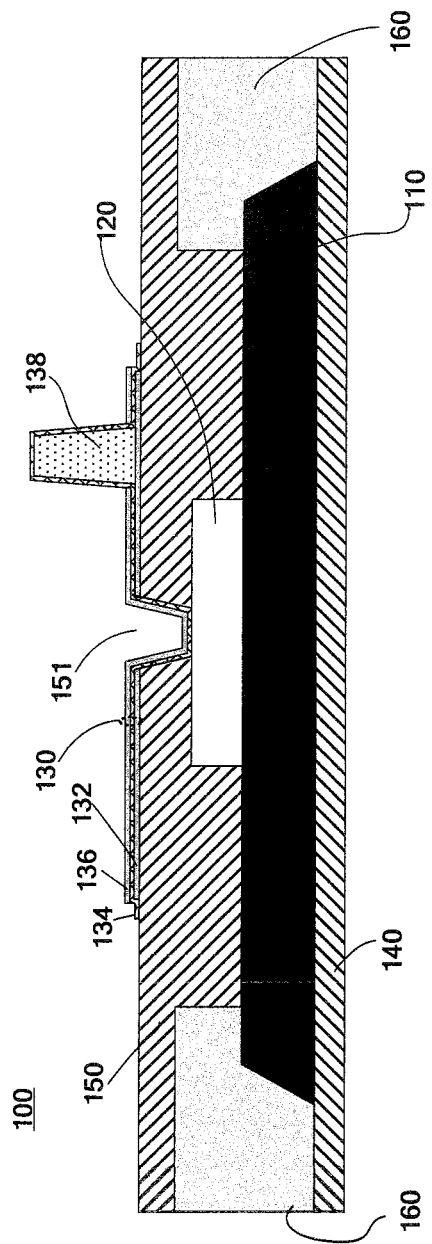
FIG. 1B illustrates a schematic structural view of a cover plate for an organic electroluminescent display device according to another embodiment of the present disclosure.

Hereinafter, exemplary embodiments of the present disclosure will be described in detail with reference to the accompanying drawings. Throughout the accompanying drawings, the same elements are denoted by the same or similar reference numerals. In the following description, some specific embodiments are for illustrative purposes only and are not to be construed as limiting the present disclosure, but merely examples of the embodiments of the present disclosure. The conventional structure or construction will be omitted when it may cause confusion with the understanding of the present disclosure. It should be illustrated that shapes and sizes of various components in the figures do not reflect true sizes and proportions, but only illustrate contents of the embodiments of the present disclosure.

Throughout the specification, the reference to "one embodiment," "an embodiment," "one example" or "an example" means that the specific features, structures or properties described in conjunction with the embodiment or example are included in at least one embodiment of the present disclosure. Therefore, the phrases "in one embodiment," "in an embodiment," "in one example" or "in an example" occurred in various positions throughout the specification may not necessarily refer to the same embodiment or example. Furthermore, specific features, structures or properties may be combined into one or more embodiments or examples in any appropriate combination and/or sub-combination.

It should also be illustrated that those skilled in the art will appreciate that terms "A is connected with B" and "A is connected to B" may be that A is directly connected with B, or A is connected with B via one or more other components. In addition, "connected with" and "connected to" herein may be "physically electrically connected", or may be "electrically coupled with" or "electrically coupled to" etc.

It should also be illustrated that, it may be understood by those skilled in the art that the terms "A is located on B" and "A is located above B" herein may imply that there may be other components included between A and B or there may not be other components included between A and B.

The applicants have discovered that in a cover plate structure of an OLED display device, light generated by the OLED may be reflected from a metal surface of a metal auxiliary cathode due to the presence of the metal auxiliary cathode, and the reflected light may further be reflected from a metal anode, and may therefore be emitted from a peripheral open region, thereby causing a phenomenon of color mixing and affecting the quality of the product.

Thus, FIG. 1A illustrates a schematic structural view of a cover plate 100 for an organic electroluminescent display device (for example, an OLED) according to an embodiment of the present disclosure.

As shown in FIG. 1A, the cover plate 100 for the organic electroluminescent display device comprises an auxiliary electrode 120 disposed on a substrate 140 to be electrically connected to an electrode of the organic electroluminescent display device; and a light reflection suppression structure 130 disposed on the auxiliary electrode 120 and configured to suppress reflection of light from a surface of the auxiliary electrode 120. With the light reflection suppression structure 130 disposed on the auxiliary electrode 120, reflection of light incident on the auxiliary electrode 120 into the organic electroluminescent display device by the auxiliary electrode 120 is alleviated, thereby improving the display effect.

FIG. 1B illustrates a schematic structural view of a cover plate 100 for an organic electroluminescent display device (for example, an OLED) according to an embodiment of the present disclosure.

In one embodiment, as shown in FIG. 1B, the cover plate 100 for the organic electroluminescent display device may further comprise a black matrix 110. The black matrix 110 is disposed on the substrate 140. An auxiliary electrode 120 is disposed on the black matrix 110 to be electrically connected to an electrode of the organic electroluminescent display device (for example, a cathode of a back plate, which will be used as an example hereinafter). A light reflection suppression structure 130 is disposed on the auxiliary electrode 120 to suppress reflection of light generated by the OLED from a surface of the auxiliary electrode 120.

In one embodiment, in a direction perpendicular to the substrate, a projection of the auxiliary electrode 120 on the substrate 140 is within a projection of the black matrix 110 on the substrate 140. The projection on the substrate is also referred herein to as a coverage.

In one embodiment, the organic electroluminescent display device is a top-emitting organic electroluminescent display device.

In one embodiment, the auxiliary electrode 120 is an auxiliary cathode. The auxiliary electrode 120 is made of a conductive material such as metal. Generally, the surface of the auxiliary electrode 120 has reflectivity with respect to light irradiated thereon.

The cover plate 100 for the organic electroluminescent display device may further comprise a protective layer 150. As shown in FIG. 1B, the protective layer 150 is disposed on the black matrix 110 and the auxiliary electrode 120. Here, the protective layer 150 has a through hole 151 disposed therein, and the through hole 151 is located above the auxiliary electrode 120. The through hole 151 is used to enable the auxiliary electrode 120 to be connected to the cathode of the back plate through the protective layer.

As shown in FIG. 1B, according to an embodiment of the present disclosure, the light reflection suppression structure 130 may comprise a stack structure of a first insulating layer 132, a conductive layer 134, and a second insulating layer 136. Here, the first insulating layer 132 is disposed on the protective layer 150, and the first insulating layer 132 has a first refractive index. As shown in FIG. 1B, the first insulating layer 132 does not cover a surface of a portion of the auxiliary electrode 120 which is exposed through the through hole 151 (i.e., the bottom of the through hole 151 in FIG. 1B) to ensure electrical connection between the auxiliary electrode 120 and the cathode of the back plate. The first insulating layer 132 is shown in FIG. 1B as not covering sidewalls of the through hole 151 (i.e., oblique sides of the through hole 151 shown as an inverted trapezoid in FIG. 1B); however, it should be understood that in other embodiments, the first insulating layer 132 may cover a part or all of the sidewalls of the through hole 151. The first insulating layer 132 is shown in FIG. 1B as having a particular length; however, it should be understood that a coverage of the first insulating layer 132 is not limited in the present disclosure. In an exemplary embodiment, the coverage of the first insulating layer 132 may be greater than a coverage of the auxiliary electrode 120.

The conductive layer 134 covers the first insulating layer 132 and is electrically connected to the surface of the auxiliary electrode 120. The conductive layer 134 is shown in FIG. 1B as completely covering first insulating layer 132. It should be understood that in other embodiments, the conductive layer 134 does not necessarily cover an outer edge portion of the first insulating layer 132. A coverage of the conductive layer 134 may also be greater than the coverage of the auxiliary electrode 120.

The conductive layer 134 is shown in FIG. 1B as covering the sidewalls and the bottom of the through hole 151 and is electrically connected to the auxiliary electrode 120 through the bottom. However, it should also be understood that in other embodiments, the conductive layer 134 may not directly cover the sidewalls of the through hole or even a portion of the bottom of the through hole 151, as long as the conductive layer 134 may be electrically connected to the auxiliary electrode 120 through a portion of the bottom of the through hole 151 which is not covered by the conductive layer 134. For example, the sidewalls or the portion of the bottom of the through hole 151 may be covered by the first insulating layer 132 or other structures.

The second insulating layer 136 covers the conductive layer 134, and the second insulating layer 136 has a second refractive index. Similarly, a coverage of the second insulating layer 136 shown in FIG. 1B is merely exemplary. However, in an exemplary embodiment, the coverage of the second insulating layer 136 may also be greater than the coverage of the auxiliary electrode 120.

The conductive layer 134 has a third refractive index greater than the first and second refractive indices. In one embodiment, a relationship between the third refractive index and the first and second refractive indices may be set, so that total reflection within the conductive layer 134 is more convenient to occur.

In one embodiment, the first refractive index is equal to the second refractive index. For example, the first insulating layer 132 and the second insulating layer 136 may be manufactured using the same material.

In one embodiment, a material of the conductive layer may comprise Indium Tin Oxide (ITO) etc., and materials of the first insulating layer and the second insulating layer may be selected from silicon nitride, silicon oxide, etc. It should be understood that the enumeration of the materials of the conductive layer, the first insulating layer and the second insulating layer herein is only for the purpose of understanding the technical solutions, and is not intended to be limiting. In other embodiments of the present disclosure, other conductive materials and insulating materials which conform to the above refractive index relationship may be selected as needed.

Further, a projection of the auxiliary electrode 120 on the substrate, a projection of the first insulating layer 132 on the substrate 140, a projection of the conductive layer 134 on the substrate 140, and a projection of the second insulating layer 136 on the substrate 140 at least partially overlap in the direction perpendicular to the substrate 140.

With the stack structure as provided above, when the light generated by the OLED is irradiated onto the second insulating layer 136, since a refractive index of air is much less than that of the second insulating layer 136, the light is further transmitted (with a small reflection ratio) to a first interface between the second insulating layer 136 and the conductive layer 134. Since the second refractive index of the second insulating layer 136 is less than the third refractive index of the conductive layer 134 at the first interface, the light is further transmitted into the conductive layer 134 (also with a small reflection ratio), and arrives at a second interface between the conductive layer 134 and the first insulating layer 132. Since the third refractive index of the conductive layer 134 is greater than the first refractive index of the first insulating layer 132 at the second interface, the light may be reflected back into the conductive layer 134 (with a small transmission ratio, wherein total reflection may even occur at an appropriate angle). The light returned from the second interface may arrive at the first interface again. At this time, since the third refractive index of the conductive layer 134 is greater than the second refractive index of the second insulating layer 136, the light may be reflected back into the conductive layer 134 again (with a small transmission ratio), is thus confined within the conductive layer 134 by the first interface and the second interface, and is continuously attenuated by the absorption of the conductive layer 134. Thus, with the stack structure, the reflection of light from the surface of the auxiliary electrode 120 is suppress, thereby avoiding the occurrence of the phenomenon of color mixing due to the reflection of the light.

The cover plate 100 for the organic electroluminescent display device may further comprise a spacer 138. In some embodiments, the spacer 138 may have a Photo Spacer (PS) structure. The spacer 138 is arranged on the first insulating layer 132 and is covered by the conductive layer 134, so that the spacer 138 may be electrically connected to the auxiliary electrode 120 through the conductive layer 134. Here, a portion of the conductive layer 134 which covers the spacer 138 is used to be electrically connected to the electrode of the organic electroluminescent display device.

With the configuration described above, the spacer 138 is disposed on the first insulating layer 132 of a non-metallic material, rather than the auxiliary electrode 120 of, generally, metal, improving the adhesion of the spacer 138 to the cover plate structure, thereby improving the product yield.

It should be understood that although the spacer 138 is shown in FIG. 1B as being arranged on the first insulating layer 132, the spacer 138 may also be arranged on the protective layer 150 according to the embodiment of the present disclosure. For example, the spacer 138 may be arranged outside the coverage of the first insulating layer 132 or may be disposed in a through hole 151 which is additionally disposed on the first insulating layer 132, as long as the spacer 138 is covered by the conductive layer 134.

It should be understood that although the conductive layer 134 is shown in FIG. 1B as completely covering the spacer 138, the conductive layer 134 may partially cover the spacer 138 according to the embodiment of the present disclosure.

It should be understood that although the spacer 138 is shown in FIG. 1B as being completely included within the light reflection suppression structure 130, the spacer 138 may be a structure disposed with the light reflection suppression structure 130 side by side according to the embodiment of the present disclosure.

In one embodiment, the spacer 138 is arranged such that, in the direction perpendicular to the substrate 140, a projection of the spacer 138 on the substrate 140 and the projection of the auxiliary electrode 120 on the substrate 140 do not overlap each other. In the embodiment shown in FIG. 1B, the reflection of light from the surface of the auxiliary electrode 120 is suppressed by the stack structure of the first insulating layer 132, the conductive layer 134 and the second insulating layer 136; however, there may not be such a stack structure at a position where the spacer 138 is arranged, and thereby the ability to suppress the reflection of the light at this position is weakened. In order to ensure the ability to suppress the reflection of the light by the cover plate 100, the spacer 138 may be disposed so as not to overlap the auxiliary electrode 120 in a direction perpendicular to the substrate 140.

The cover plate 100 for the organic electroluminescent display device may further comprise a color film layer 160. The color film layer 160 is disposed on the substrate 140 and is divided into a plurality of regions by the black matrix 120. For example, it is shown in FIG. 1B that the color film layer 160 is divided into two parts by the black matrix.

Figure 2:
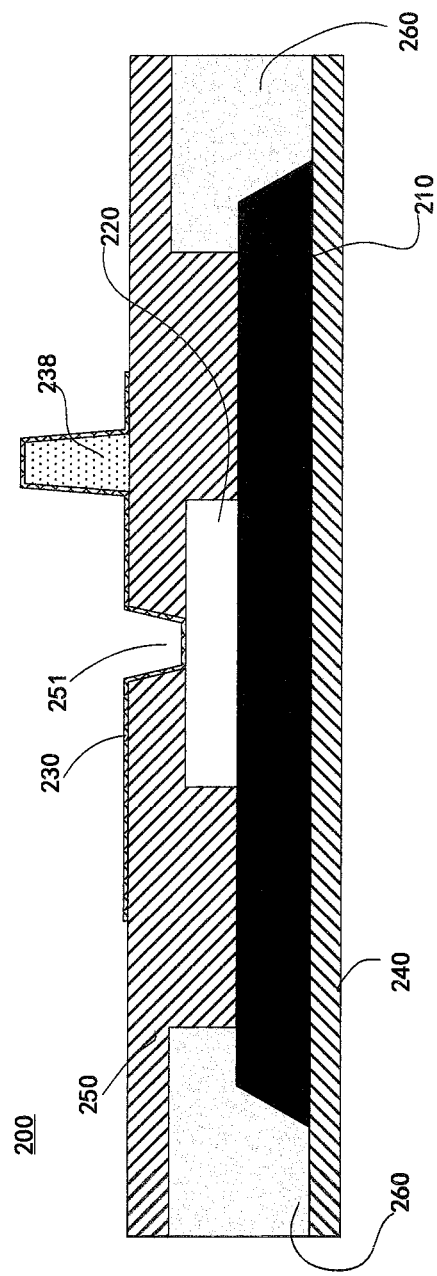
FIG. 2 illustrates a schematic structural view of a cover plate for an organic electroluminescent display device according to yet another embodiment of the present disclosure.

FIG. 2 illustrates a schematic structural view of a cover plate 200 for an organic electroluminescent display device (for example, an OLED) according to another embodiment of the present disclosure.

A black matrix 210, an auxiliary electrode 220, a substrate 240, a protective layer 250, and a color film layer 260 shown in FIG. 2 may be implemented using the black matrix 110, the auxiliary electrode 120, the substrate 140, the protective layer 150, and the color film layer 160 shown in FIG. 1B respectively, the description of these components in FIG. 1B is also applicable in FIG. 2, and details thereof will not be described here again.

The cover plate 200 for the organic electroluminescent display device shown in FIG. 2 differs from the structure of the cover plate 100 for the organic electroluminescent display device shown in FIG. 1B in that there is a different light reflection suppression structure 230, which may result in a different arrangement of a spacer 238. The difference between the cover plate 200 for the organic electroluminescent display device and the cover plate 100 for the organic electroluminescent display device will be mainly described below in terms of the light reflection suppression structure and the spacer.

In FIG. 2, the light reflection suppression structure 230 is formed as a single conductive layer. The conductive layer covers the protective layer 250 and is electrically connected to the auxiliary electrode 220 through a through hole in the conductive layer which is above the auxiliary electrode 220. An upper surface of the conductive layer is a diffuse reflective surface to diffusely reflect light incident thereon, thereby alleviating a phenomenon of color mixing due to specular reflection from the surface of the auxiliary electrode 220.

In order to ensure an effect of suppressing the reflection of the light, in the embodiment of the present disclosure, a coverage of the conductive layer may be greater than a coverage of the auxiliary electrode 220. In addition, it should be illustrated that in order to avoid the influence of the diffuse reflective surface on the light which needs to be emitted from the color film layer 260, in the embodiment of the present disclosure, the coverage of the conductive layer is further confined within a coverage of the black matrix 210.

The cover plate 200 for the organic electroluminescent display device further comprises a spacer 238. In some embodiments, the spacer 238 may have a photo spacer structure. The spacer 238 is arranged on the protective layer 250 and is covered by the conductive layer. Here, a portion of the conductive layer which covers the spacer 238 is used to be electrically connected to an electrode of the organic electroluminescent display device.

With the configuration described above, the spacer 238 is disposed on the protective layer 230 of a non-metallic material, rather than the auxiliary electrode 220 of, generally, metal, which may improve the adhesion of the spacer 238 to the cover plate structure, thereby improving the product yield.

It should be understood that although the conductive layer is shown in FIG. 2 as completely covering the spacer 238, in other embodiments, the conductive layer may partially cover the spacer 238.

In one embodiment, the spacer 238 is arranged not to overlap the auxiliary electrode 220 in a direction perpendicular to the substrate 240. However, it should be understood that in other embodiments, the spacer 238 may be arranged such that in a direction perpendicular to the substrate 240, a projection of the spacer 238 on the substrate 240 and a projection of the auxiliary electrode 220 on the substrate 240 at least partially overlap. For example, when this overlapping condition occurs between the spacer 238 and the auxiliary electrode 220, a surface of the spacer 238 corresponding to the overlapping portion is completely covered by the conductive layer.

Figure 3:
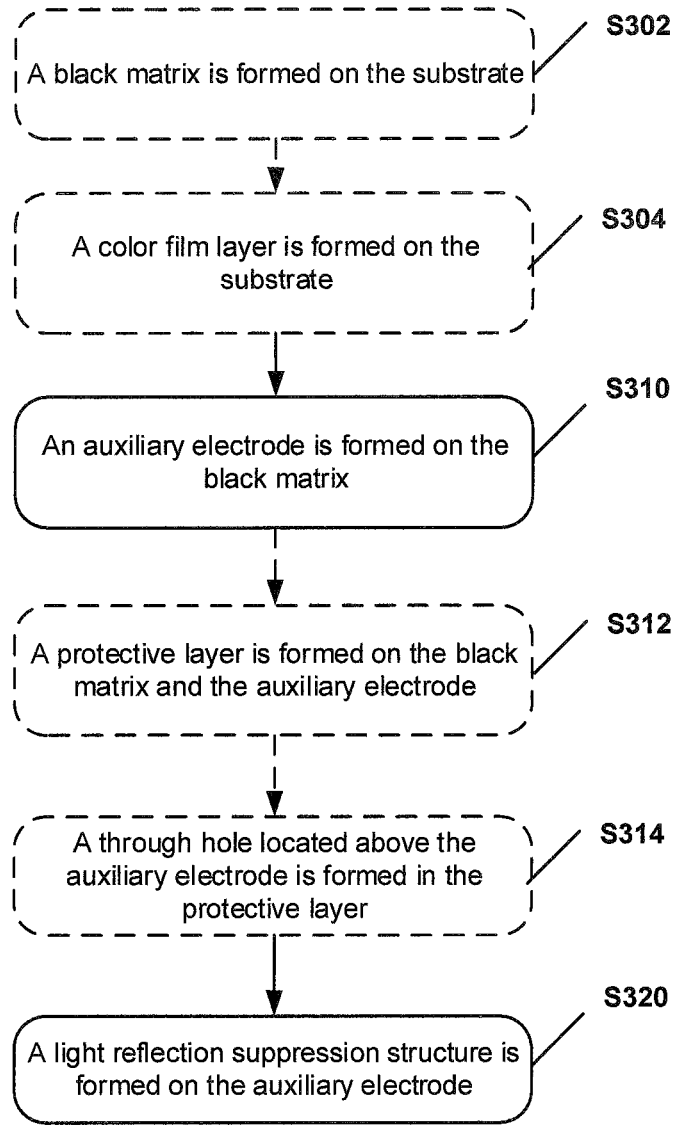
FIG. 3 illustrates a flowchart of a method of manufacturing a cover plate for an organic electroluminescent display device according to an embodiment of the present disclosure.

FIG. 3 illustrates a flowchart of a method 300 for manufacturing a cover plate for an organic electroluminescent display device according to an embodiment of the present disclosure. It should be illustrated that serial numbers of the respective steps in the following method are only used as a representation of the steps for convenience of the description, and should not be regarded as indicating an execution order of the respective steps. This method does not need to be performed exactly as shown, unless explicitly stated.

The method 300 starts at step S310, in which an auxiliary electrode is formed to be electrically connected to an electrode of the organic electroluminescent display device. Then, in step S320, a light reflection suppression structure for suppressing reflection of light from a surface of the auxiliary electrode is formed on the auxiliary electrode. For example, the auxiliary electrode may be a metal electrode.

In one embodiment, step S320 comprises: forming a first insulating layer, forming a conductive layer on the first insulating layer, so that the conductive layer is electrically connected to the surface of the auxiliary electrode, and forming a second insulating layer on the conductive layer. In this embodiment, the first insulating layer has a first refractive index, the second insulating layer has a second refractive index, and the conductive layer has a third refractive index greater than the first and second refractive indices.

In one embodiment, the method 300 further comprises steps S312 and S314. In step S312, a protective layer is formed on the auxiliary electrode. In step S314, a through hole located above the auxiliary electrode is formed in the protective layer. Here, the first insulating layer is formed on the protective layer, and the conductive layer is electrically connected to the auxiliary electrode through the through hole. In this embodiment, step S320 further comprises: arranging a spacer on the protective layer or the first insulating layer, and forming the conductive layer on the spacer, so that the spacer is connected to the auxiliary electrode through the conductive layer. Here, a portion of the conductive layer which covers the spacer is formed to be electrically connected to the electrode of the organic electroluminescent display device.

In another embodiment, step S320 comprises: forming a conductive layer on the protective layer, so that the conductive layer is electrically connected to the surface of the auxiliary electrode. In this embodiment, an upper surface of the conductive layer is a diffuse reflective surface. In this embodiment, step S320 may further comprise: forming a protective layer between the auxiliary electrode and the conductive layer, and forming a through hole in the protective layer above the auxiliary electrode, wherein the conductive layer is electrically connected to the auxiliary electrode through the through hole. In this embodiment, step S320 further comprises: arranging a spacer on the protective layer, wherein the spacer is covered by the conductive layer, so that the spacer is connected to the auxiliary electrode through the conductive layer. Here, a portion of the conductive layer which covers the spacer is formed to be electrically connected to the electrode of the organic electroluminescent display device.

In one embodiment, the method 300 further comprises step S302 of forming a black matrix on the substrate. Here, the auxiliary electrode is formed on the black matrix, and in a direction perpendicular to the substrate, a projection of the auxiliary electrode on the substrate is located within a projection of the black matrix on the substrate.

In one embodiment, the method 300 further comprises a step S304 of forming a color film layer on the substrate, wherein the color film layer is divided into a plurality of regions by the black matrix.

Various embodiments of the method 300 described above may be used to manufacture the cover plates 100 and 200 for the organic electroluminescent display device as shown in FIGS. 1A, 1B and 2, respectively. Therefore, the explanations and illustrations made above in connection with FIGS. 1A, 1B and 2 are equally applicable in the method of FIG. 3 and will not be described in detail here.

It should also be illustrated that although steps S302, S304, S312, and S314 are shown in FIG. 3, these steps are not necessary in some embodiments, and therefore, these steps are shown by dashed lines.

Further, the present disclosure further provides an organic electroluminescent display device.

Figure 4:
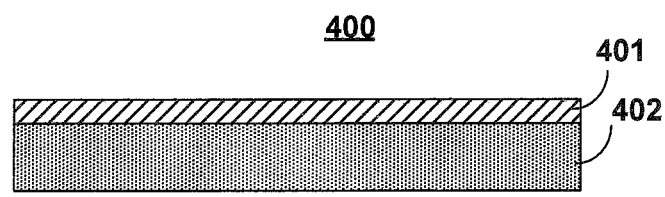
FIG. 4 illustrates a structural diagram of an organic electroluminescent display device according to an embodiment of the present disclosure.

FIG. 4 illustrates a structural diagram of an organic electroluminescent display device according to an embodiment of the present disclosure. As shown in FIG. 4, an organic electroluminescent display device 400 comprises a cover plate 401 and a light-emitting component 402. The cover plate 401 may be implemented using the cover plate 100 or 200 for the organic electroluminescent display device according to any of the above embodiments. The light-emitting component may comprise, for example, but not limited to, a back plate and related components. An auxiliary electrode in the cover plate 401 may be electrically connected to an electrode in the back plate, for example, through a conductive layer in the cover plate 401 which covers a spacer as described above. However, it should be understood by those skilled in the art that FIG. 4 is merely illustrative, and connections and positional relationships between the cover plate 401, the light-emitting component 401 in the organic electroluminescent display device 400, and other components are not limited thereto.

Figure 5:
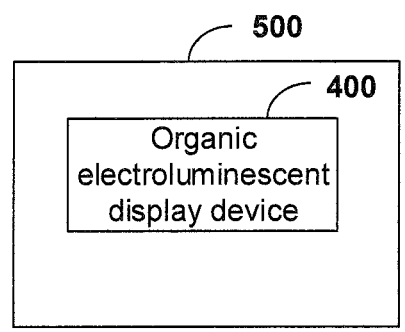
FIG. 5 illustrates a structural diagram of a display apparatus according to an embodiment of the present disclosure.

In addition, the present disclosure further provides a display apparatus. FIG. 5 illustrates a structural diagram of a display apparatus according to an embodiment of the present disclosure. As shown in FIG. 5, a display apparatus 500 comprises the organic electroluminescent display device 400 described above.

The detailed description above has set forth numerous embodiments by using schematic diagrams, flowcharts and/or examples. In a case where such schematic diagrams, flowcharts, and/or examples comprise one or more functions and/or operations, it should be understood by those skilled in the art that each of the functions and/or operations in such schematic diagrams, flowcharts, or examples may be implemented individually and/or collectively by various structures, hardware, software, firmware or substantially any combination thereof.

Although the present disclosure has been described with reference to a few exemplary embodiments, it is understood that the terms used are illustrative and exemplary and not restrictive. The present disclosure may be embodied in a variety of forms without departing from the spirit or substance of the present disclosure. Therefore, it is to be understood that the embodiments described above are not limited to any detail described above, but are construed broadly within the spirit and scope defined by the appended claims. Accordingly, all changes and modifications which fall within the scope of the claims or the equivalents thereof are intended to be covered by the appended claims.

I claim:

1. A cover plate for an organic electroluminescent display device, comprising:
   an auxiliary electrode disposed on a substrate to be electrically connected to an electrode of the organic electroluminescent display device; and
   a light reflection suppression structure disposed on the auxiliary electrode and configured to suppress reflection of light from a surface of the auxiliary electrode, wherein the light reflection suppression structure comprises a first insulating layer, a conductive layer and a second insulating layer which are stacked, wherein the conductive layer is disposed on the first insulating layer, and is electrically connected to the auxiliary electrode, and the second insulating layer is disposed on the conductive layer, wherein the first insulating layer has a first refractive index, the second insulating layer has a second refractive index, and the conductive layer has a third refractive index greater than the first and second refractive indices.

2. The cover plate according to claim 1, wherein in a direction perpendicular to the substrate, a projection of the auxiliary electrode on the substrate, a projection of the first insulating layer on the substrate, a projection of the conductive layer on the substrate and a projection of the second insulating layer on the substrate at least partially overlap.

3. The cover plate according to claim 1, further comprising: a protective layer disposed on the auxiliary electrode, wherein the conductive layer is electrically connected to the auxiliary electrode through a through hole in the protective layer which is above the auxiliary electrode.

4. The cover plate according to claim 3, further comprising: a spacer arranged on the protective layer or the first insulating layer and covered by the conductive layer, wherein a portion of the conductive layer which covers the spacer is used to be electrically connected to the electrode of the organic electroluminescent display device.

5. The cover plate according to claim 4, wherein in a direction perpendicular to the substrate, a projection of the photo spacer on the substrate and a projection of the auxiliary electrode on the substrate do not overlap each other.

6. The cover plate according to claim 1, wherein the light reflection suppression structure comprises: a conductive layer, wherein a surface of the conductive layer away from the substrate is a diffuse reflective surface.

7. The cover plate according to claim 6, further comprising: a spacer arranged on a protective layer and covered by the conductive layer, wherein a portion of the conductive layer which covers the spacer is used to be electrically connected to the electrode of the organic electroluminescent display device.

8. The cover plate according to claim 7, wherein in a direction perpendicular to the substrate, a projection of the spacer on the substrate and a projection of the auxiliary electrode on the substrate do not overlap each other.

9. The cover plate according to claim 6, further comprising: a protective layer disposed between the auxiliary electrode and the conductive layer, wherein the conductive layer is electrically connected to the auxiliary electrode through a through hole in the protective layer which is above the auxiliary electrode.

10. The cover plate according to claim 1, further comprising: a black matrix disposed between the substrate and the auxiliary electrode, and in a direction perpendicular to the substrate, a projection of the auxiliary electrode on the substrate is located within a projection of the black matrix on the substrate.

11. An organic electroluminescent display device, comprising the cover plate for the organic electroluminescent display device according to claim 1.

12. A display apparatus, comprising the organic electroluminescent display device according to claim 11.

13. A method for manufacturing a cover plate for an organic electroluminescent display device, comprising:
   forming an auxiliary electrode to be electrically connected to an electrode of the organic electroluminescent display device;
   forming, on the auxiliary electrode, a light reflection suppression structure for suppressing reflection of light from a surface of the auxiliary electrode;
   forming a first insulating layer;
   forming a conductive layer on the first insulating layer, so that the conductive layer is electrically connected to the auxiliary electrode; and
   forming a second insulating layer on the conductive layer, wherein the first insulating layer has a refractive index, the second insulating layer has a second refractive index, and the conductive layer has a third refractive index greater than the first and second refractive indices.

14. The method according to claim 13, further comprising:
   forming a protective layer on the auxiliary electrode; and
   forming a through hole in the protective layer above the auxiliary electrode,
   wherein the first insulating layer is disposed on the protective layer, and the conductive layer is electrically connected to the auxiliary electrode through the through hole.

15. The method according to claim 14, further comprising:
   forming a spacer on the protective layer or the first insulating layer,
   wherein the spacer is covered by the conductive layer, so that the spacer is connected to the auxiliary electrode through the conductive layer, and wherein a portion of the conductive layer which covers the spacer is used to be electrically connected to the electrode of the organic electroluminescent display device.

16. The method according to claim 13, wherein the step of forming a light reflection suppression structure comprises:
   forming a conductive layer, so that the conductive layer is electrically connected to the auxiliary electrode, wherein a surface of the conductive layer away from the substrate is a diffuse reflective surface.

17. The method according to claim 16, further comprising:
   forming a protective layer between the auxiliary electrode and the conductive layer; and
   forming a through hole in the protective layer above the auxiliary electrode, wherein the conductive layer is electrically connected to the auxiliary electrode through the through hole.

18. The method according to claim 17, further comprising:
   forming a spacer on the protective layer,
   wherein the spacer is covered by the conductive layer, so that the spacer is connected to the auxiliary electrode through the conductive layer, and wherein a portion of the conductive layer which covers the spacer is used to be electrically connected to the electrode of the organic electroluminescent display device.

\* \* \* \* \*